United States Patent
Mohn et al.

[19]

[11] Patent Number: 6,027,606
[45] Date of Patent: Feb. 22, 2000

[54] CENTER GAS FEED APPARATUS FOR A HIGH DENSITY PLASMA REACTOR

[75] Inventors: John Mohn; Mei Chang, both of Saratoga; Raymond Hung, San Jose; Kenneth Collins, San Jose; Ru-Liang Julian Lee, San Jose, all of Calif.

[73] Assignee: Applied Materials, Inc., Santa Clara, Calif.

[21] Appl. No.: 09/108,950

[22] Filed: Jun. 30, 1998

Related U.S. Application Data

[63] Continuation of application No. 08/570,764, Dec. 12, 1995, abandoned.

[51] Int. Cl.[7] .................................................... H05H 1/00
[52] U.S. Cl. ................. 156/345; 118/723 I; 118/723 IR
[58] Field of Search ........................ 156/345; 118/723 I, 118/723 IR

[56] References Cited

U.S. PATENT DOCUMENTS 4,948,458  8/1990  Ogle .
5,187,454  2/1993  Collins et al. .
5,392,018  2/1995  Collins et al. .

FOREIGN PATENT DOCUMENTS 0 553 704 A1  8/1993  European Pat. Off. .
0 637 055 A1  2/1995  European Pat. Off. .
0 651 427 A1  5/1995  European Pat. Off. .
2 231 197    11/1990  United Kingdom .

*Primary Examiner*—Thi Dang
*Attorney, Agent, or Firm*—Michaelson and Wallace

[57] ABSTRACT

The invention is embodied by a plasma reactor for processing a workpiece, including a reactor enclosure defining a processing chamber, a semiconductor ceiling window, a base within the chamber for supporting the workpiece during processing thereof, the semiconductor ceiling including a gas inlet system for admitting a plasma precursor gas into the chamber through the ceiling, and apparatus for coupling plasma source power into the chamber.

23 Claims, 3 Drawing Sheets

CENTER GAS FEED APPARATUS FOR A HIGH DENSITY PLASMA REACTOR

CROSS REFERENCE TO RELATED APPLICATIONS

This application is a continuation of Ser. No. 08/570,764, filed Dec. 12, 1995, abandoned, entitled "CENTER GAS FEED APPARATUS FOR HIGH DENSITY PLASMA REACTOR", which is hereby incorporated by reference.

BACKGROUND OF THE INVENTION

1. Technical Field

The invention relates to a plasma reactor having ceiling and a workpiece support for interposition therebetween of a workpiece to be processed, such as a semiconductor wafer, wherein the processing gases are fed through the ceiling directly over the workpiece.

2. Backaround Art

The inductively coupled plasma reactor disclosed in U.S. Pat. No. 4,948,458 has a planar coil overlying the chamber ceiling and facing the semiconductor wafer being processed, thereby providing an optimally uniform RF induction field over the surface of the wafer. For this purpose, the ceiling, which seals the reactor chamber so that it can be evacuated, must be fairly transmissive to the RF induction field from the coil and is therefore a dielectric, such as quartz. It should be noted here that such a ceiling could be made from dielectric materials other than quartz, such as aluminum oxide. However other materials such as aluminum oxide tend produce greater contamination than quartz due to sputtering.

Polymerization during a plasma etch process requires a careful balance of etchant and polymer, the etchant concentration typically being at a depletion level to avoid inhibition of appropriate polymer formation. As a result, a significant proportion of etchant ions and radicals formed near the wafer periphery are consumed before reaching the wafer center, further depleting the etch ion concentration over the wafer center. This leads to a lower etch rate or etch stopping near the wafer center.

One reason that there are more ions at the wafer periphery is that introduction of the etchant precursor gas from the side can produce a non-uniform etchant ion/radical distribution favoring the side. Many of the etchant ion/radical-forming energetic electrons generated near the side are lost to collisions with other species before reaching the wafer center, thus reducing the etchant ion concentration at the wafer center. The relative lack of etchant ions near the wafer center permits faster formation of polymer at the wafer center, so much so that in some cases the polymer formation overwhelms the etch process and stops it, particularly at feature sizes less than 0.5 microns. Such etch stopping may occur either at larger etch features, at shallower etch depths or at shorter etch times.

The converse of the foregoing is that the relative plentitude of etchant ions and radicals near the wafer periphery can, under selected processing conditions, so impede polymerization as to impair etch selectivity, possibly leading to punchthrough of the underlying layer near the wafer periphery, in addition to causing a much higher etch rate at the wafer periphery.

From the foregoing, it is clear that there is a tradeoff between avoiding punchthrough at the wafer edge and avoiding etch stopping at the wafer center, dictating a very narrow window of processing parameters within which a successful etch process may be realized across the entire wafer surface. To avoid the overetching the wafer periphery, the concentration of etchant ions and radicals in the plasma relative to other particles (e.g., polymer-forming ions or radicals and carbon) may be decreased, which risks etch-stopping at the wafer center. Conversely, to avoid etch-stopping at the wafer center, the concentration of etchant ions in the plasma may be increased, which risks punch-through or faceting near the wafer periphery. Thus, the process window for successfully etching the entire wafer is very narrow.

In the parallel plate plasma reactor, the concentration of free fluorine in the plasma can be controlled by introducing a scavenging article, such as silicon, near or at the top of the reactor chamber. Silicon atoms physically etched (sputtered), chemically etched or reactive ion etched from the scavenging article combine with the fluorine ions and radicals, thereby reducing fluorine ion and radical concentration in the plasma. By controlling the rate at which silicon atoms are physically or chemically etched from the scavenging article, the amount of free fluorine ions and radicals in the plasma may be regulated (e.g., reduced) as desired to meet the narrow processing window mentioned above. The physical or chemical etch rates can be controlled by controlling the temperature of the scavenging article and/or by controlling the rate of ion-bombardment on the scavenging article. The surface of the scavenging article may be activated (to release silicon atoms into the plasma) either by RF power or by heating. By holding the scavenging article's temperature below the temperature at which polymerization occurs, the polymers accumulate on the scavenging article surface and block any release therefrom of silicon atoms. By raising the scavenging article's temperature above the condensation temperature, the surface is free from polymers, thus permitting the release of silicon atoms into the plasma. Further increasing the temperature increases the rate at which silicon atoms are released from the scavenging surface into the plasma. Reducing the free fluorine concentration in this manner has the effect of not only decreasing etch rate but also enriching the carbon content of the polymer, thus increasing the effect of the polymer on the etch process to guard against punch through at the wafer periphery, but increasing the risk of etch stopping at the wafer center. Conversely, increasing the free fluorine concentration not only increases the etch rate but also depletes the carbon content of the polymer, thus decreasing the effect of polymerization on the etch process, thus decreasing the risk of etch stopping at the wafer center but weakening the protection against punch through at the wafer periphery.

Thus, in order to meet the narrow processing window, in general the relative concentrations of free fluorine and polymer-forming ions and radicals in the plasma may be controlled by regulating the temperature of a scavenging article in the chamber.

It is an object of the invention to eliminate or reduce consumable materials such as quartz or ceramics in the chamber walls, so as to avoid depletion of plasma ions near the chamber walls and consumption of expensive reactor components through etching of such materials.

It is a further object of the invention to enhance processing uniformity at the wafer center relative to the wafer periphery in such a reactor by providing a uniform etch and polymer precursor gas distribution. Specifically, it is an object of the invention to introduce such gas from an optimum radial location of the chamber, such as from the chamber center and/or from the chamber periphery, whichever optimizes process uniformity across the wafer surface. For example, where etch rate is low at the wafer center and high at the wafer periphery, the gas is preferably introduced from the center of the ceiling rather than from near the periphery of the ceiling.

SUMMARY OF THE INVENTION

The invention is embodied in a plasma reactor for processing a workpiece, including a reactor enclosure defining a processing chamber, a semiconductor ceiling, a base within the chamber for supporting the workpiece during processing thereof, a gas inlet system for admitting a plasma precursor gas into the chamber, and apparatus for coupling plasma source power into the chamber. The gas inlet system includes a set of gas inlet ports through the semiconductor ceiling over the planar substrate. These gas inlet ports may be concentrated over the wafer center and/or may be distributed to overlie the wafer periphery. A center gas feed top is sealed onto an exterior surface of the semiconductor ceiling, forming a gas manifold between the center gas feed top and the semiconductor window electrode, the gas manifold encompassing the gas inlet ports.

In one embodiment, a semiconductor baffle extends across the manifold and dividing the manifold into a pair of sub-manifolds, one of the sub-manifolds being adjacent the center gas feed top and the other of the sub-manifolds being adjacent the gas inlet ports, and plural gas feed passages through the semiconductor baffle offset from the gas inlet ports.

BRIEF DESCRIPTION OF THE DRAWINGS

FIGS. 2A through 2E illustrate one embodiment of a center gas feed silicon ceiling, of which FIG. 2A is a bottom perspective view of the gas feed top, FIG. 2B is a bottom perspective view of an annular seal therefor, FIG. 2C is a cross-sectional view of the seal of FIG. 2B, FIG. 2D is a top perspective view of the silicon ceiling showing the gas feed holes and FIG. 2E is a partial cross-sectional view of the silicon ceiling of FIG. 2D.

DETAILED DESCRIPTION OF THE PREFERRED EMBODIMENTS

Figure 1:
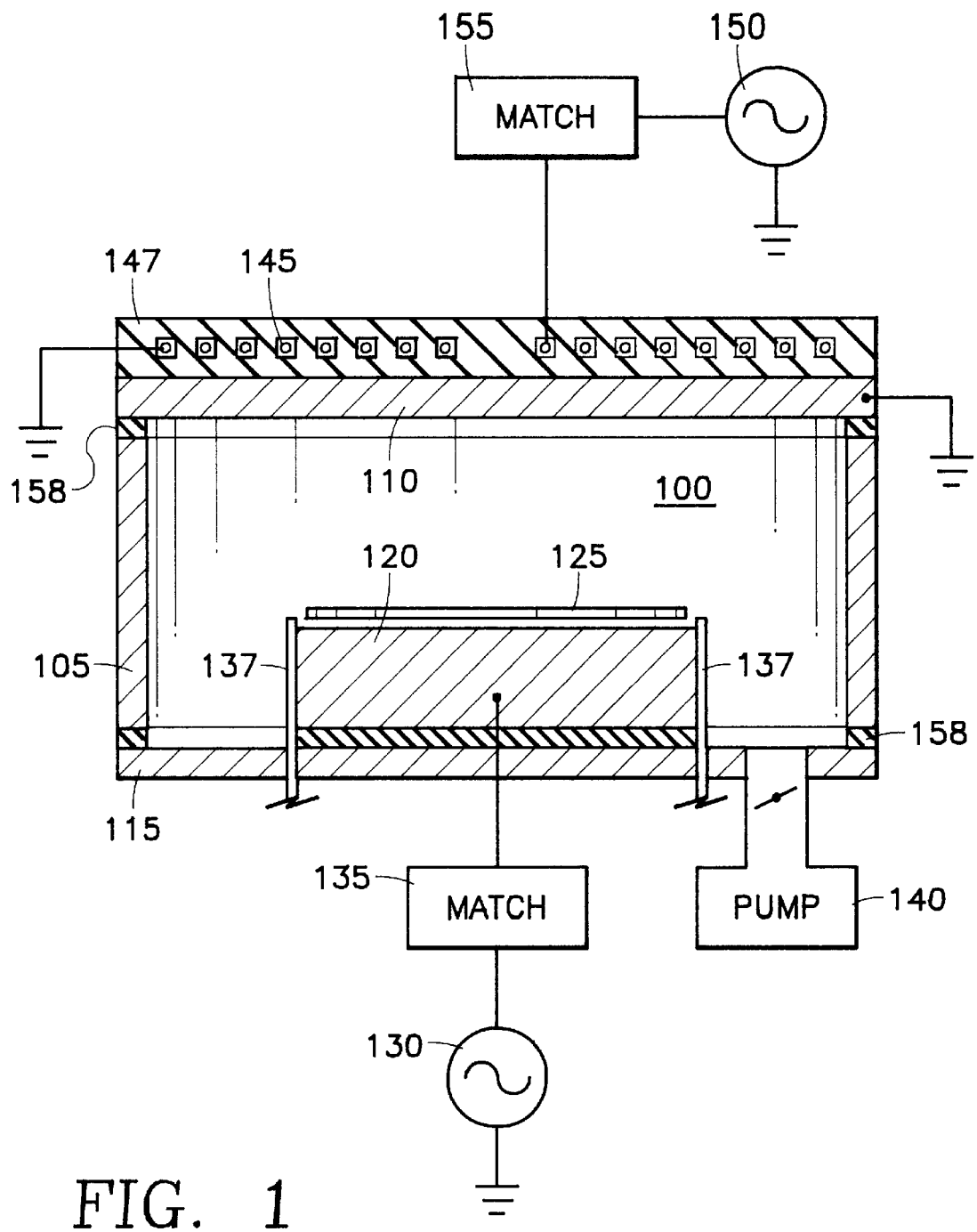
FIG. 1 illustrates a plasma reactor embodying the invention and having a planar coil antenna overlying a center gas feed silicon ceiling having gas feed orifices extending therethrough.

Referring to FIG. 1, a plasma reactor includes a sealed cylindrical chamber 100 enclosed by a cylindrical side wall 105, a disk-shaped semiconductor ceiling 110 and a base 115. The semiconductor ceiling 110 is formed of a semiconductor material such as silicon or silicon-containing material such as silicon carbide, or other suitable semiconductor materials that do not necessarily contain silicon. In the presently preferred embodiment the semiconductor ceiling 110 is silicon. A wafer pedestal 120 supports a semiconductor wafer or workpiece 125 to be processed by the reactor. The wafer pedestal 120 may be an electrostatic chuck assembly, as disclosed in co-pending U.S. patent application Ser. No. 08/507,726 filed Jul. 26, 1995 by Kenneth S. Collins et al. entitled "PLASMA SOURCE WITH AN ELECTRONICALLY VARIABLE DENSITY PROFILE" and assigned to the assignee of the present application, the disclosure of which is incorporated herein by reference. A bias RF power generator 130 applies a bias potential to the wafer pedestal 120 through an impedance match circuit 135 of the type well-known in the art. Impedance match circuits are disclosed, for example, in U.S. Pat. No. 5,392,018 to Collins et al. and U.S. Pat. No. 5,187,454 to Collins et al. Gas inlets 137 through the silicon ceiling 110 admit a processing gas such as an etchant precursor gas such as a $C_x F_x$ gas. A vacuum pump 140 evacuates the chamber 100 to a desired pressure. An overhead inductive coil antenna 145 held over the ceiling 110 in an insulating antenna holder 147 is connected to a plasma source RF power generator 150 through another conventional impedance match circuit 155 and inductively couples RF power into the chamber through the ceiling 110.

One advantage of the plasma reactor of FIG. 1 is the even distribution across the entire wafer surface of the process gas from the gas inlet holes 137 through the ceiling 110. Another advantage is that the material that may be sputtered from the silicon ceiling 110 is not incompatible with a silicon dioxide etch process. A related advantage is that the material sputtered from the silicon ceiling is a scavenger for fluorine. A further advantage is that the silicon ceiling can have a thermal coefficient of expansion compatible with that of other structural members of the chamber consisting of silicon.

As mentioned previously herein, one factor that can give rise to plasma etch processing differences between the wafer center and the wafer periphery non-uniform etch precursor gas distribution. Such non-uniformity in gas distribution arises from the introduction of the gas from the side of wafer pedestal in conventional plasma reactors, so that there is relatively more etchant precursor gas near the wafer periphery and relatively less etchant precursor gas near the wafer center. This problem is addressed in the embodiment of the silicon ceiling 110 of FIGS. 2A, 2B, 2C, 2D and 2E, which includes a center gas feed system built into the silicon ceiling 110 for introducing the etch precursor gas directly over the wafer in a symmetrical manner relative to the wafer center.

Figure 2A:
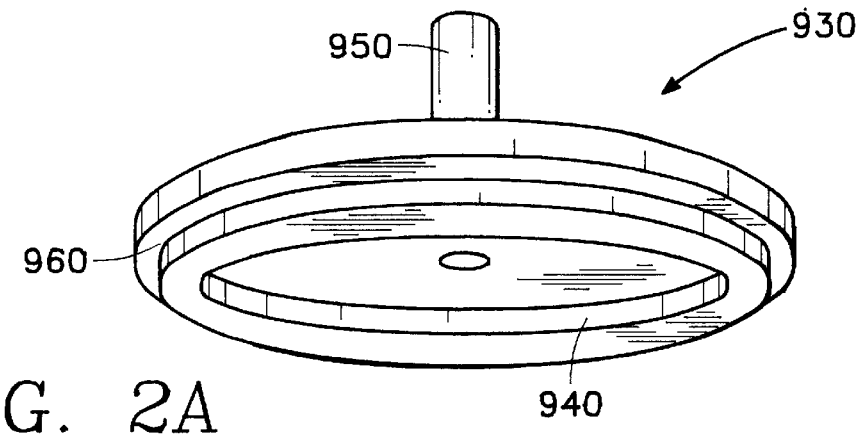
Figure 2B:
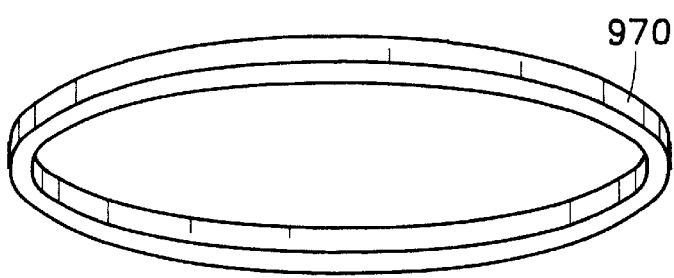
Figure 2D:
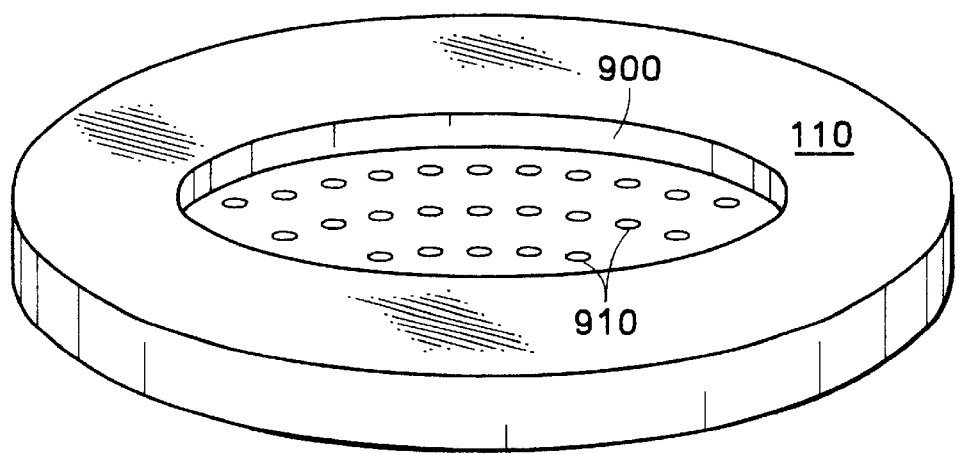
Figure 2C:
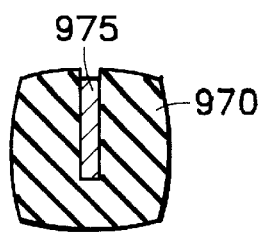
Figure 2E:
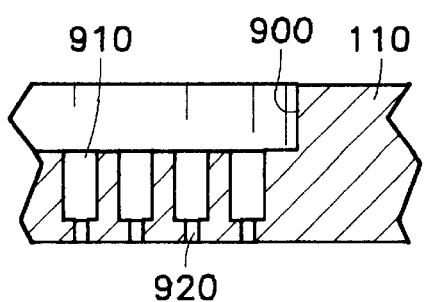

Referring to FIG. 2D, the 1-inch thick silicon ceiling 110 has an approximately 0.33-inch deep 3.5-inch diameter counterbored opening 900 in its top surface. Preferably, as shown in FIG. 2E, about twenty-two symmetrically placed 0.20-inch diameter holes 910 are drilled down from the top surface of the counterbore opening 900 through about 80% of the thickness of the ceiling 110. Small 0.030-inch diameter holes 920 concentric with the larger holes 910 are laser-drilled and/or ultrasonically drilled from the bottom surface of the silicon ceiling 110. As shown in FIGS. 2A and 2B, a disk-shaped gas feed top 930 fits snugly within the counterbore opening 900 in the top surface of the silicon ceiling 110. The bottom surface of the gas feed top 930 has an approximately 0.01-inch deep 3.3-inch diameter counterbore opening 940 therein which forms a gas distribution manifold. A center gas feed pipe 950 passes through the center of the gas feed top 930 and opens into the counterbore opening 940. The bottom peripheral corner of the gas feed top has a step 960 cut out therein, the step 960 being 0.143-inch deep and extending 0.075-inch radially inwardly. The step 960 creates a circumferential pocket into which an annular teflon seal 970 having dimensions matching those of the step 960 snugly fits. Preferably, the teflon seal 970 has a U-shaped cross-section, as illustrated in FIG. 2C. An annular steel wire stiffener 975 within the teflon seal 970 provides stiffness for the seal 970.

The advantage is that the reactor's center-to-edge etch uniformity is enhanced by the uniform etchant precursor gas distribution across the wafer surface achieved with the center gas feed silicon ceiling 110 of FIGS. 2A–E FIG. 3A illustrates another preferred embodiment of the center gas feed silicon ceiling which better protects the gas feed top from the plasma. In this embodiment, a shoulder 980 is provided along the circumferential edge of the counterbore opening 900 in the silicon ceiling 110. A silicon wafer 985 rests on the shoulder 980 and separates into two separate chambers the counterbore opening 900 in the top of the silicon ceiling 110 and the counterbore opening 940 in the bottom of the gas feed top 930. The silicon wafer 985 has plural gas feed holes 986 drilled therethrough which are all laterally displaced from the gas feed holes 910 in the silicon ceiling 110. The interposition of the silicon wafer 985 in this manner eliminates any direct-line path to the gas feed top 930 for plasma ions diffusing upwardly from the chamber through the holes 920. This feature better protects the top 930 from attack by the plasma. The top 930 is either a material such as a semiconductor or a dielectric which does not appreciably attenuate the RF inductive field, or, if its diameter is less than the diameter of the center null of the inductive antenna, may be a conductor such as stainless steel.

Figure 3A:
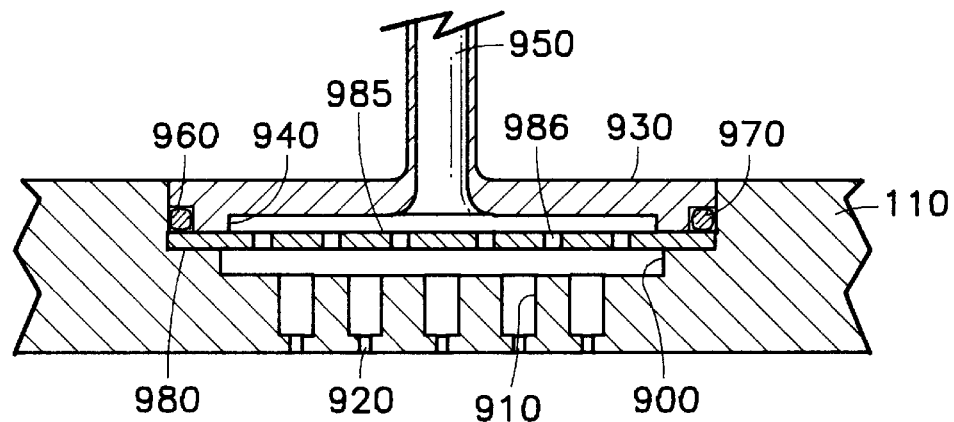
FIG. 3A is a cross-sectional view of another embodiment of the center gas feed silicon ceiling having a pair of gas plenums separated by a silicon wafer baffle.
Figure 3B:
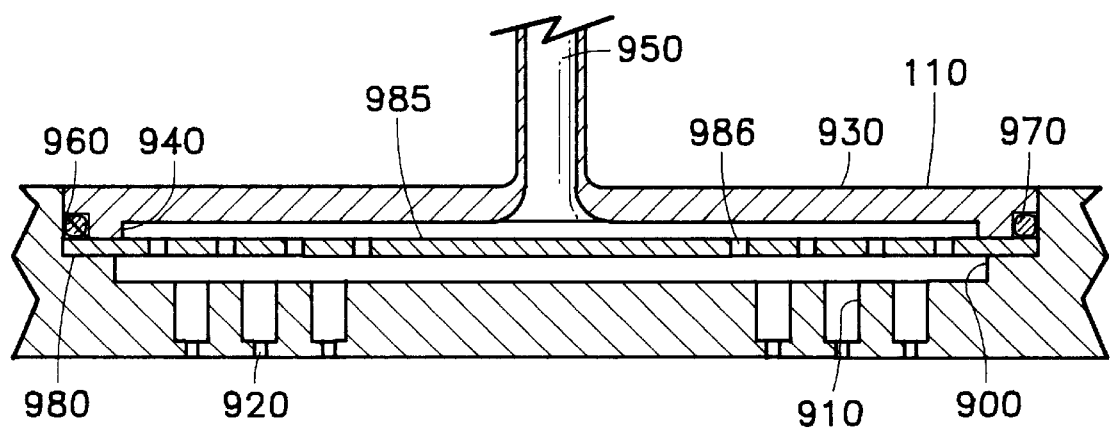
FIG. 3B illustrates an alternative embodiment corresponding to FIG. 3A.

In the embodiments of FIGS. 2A–E and 3A, the gas feed holes 910, 920 are grouped about the center of the ceiling 110. However, in either embodiment the holes 910, 920 may be distributed from the center out to the periphery, if desired, or may be grouped about the periphery instead of the center. This is illustrated in FIG. 3B, in which the gas feed holes 910, 920 are distributed about the periphery of the ceiling 110.

While the invention has been described by specific reference to preferred embodiments, it is understood that variations and modifications thereof may be made without departing from the true spirit and scope of the invention.

What is claimed is:

1. A plasma reactor for processing a workpiece, said reactor comprising:
    a reactor enclosure defining a processing chamber;
    a base within said chamber for supporting said workpiece during processing thereof;
    said reactor enclosure comprising a semiconductor ceiling overlying said base, said semiconductor ceiling coupled in vacuum sealed relationship to said reactor enclosure to create and to maintain a vacuum seal within said processing chamber;
    apparatus overlying said semiconductor ceiling for coupling plasma source power into said chamber;
    an inlet system in said semiconductor ceiling opening into said chamber.

2. The plasma reactor of claim 1 wherein said inlet system is a gas inlet system for admitting a plasma precursor gas into said chamber.

3. The reactor of claim 1 wherein said gas inlet system comprises plural gas inlet ports in said semiconductor ceiling opening into said chamber.

4. The plasma reactor of claim 1 wherein said workpiece is a planar substrate, said semiconductor ceiling comprises a ceiling portion of said reactor enclosure generally parallel to and overlying said planar substrate.

5. The reactor of claim 4 wherein said apparatus for coupling plasma source power into said chamber comprises an inductive antenna facing said planar substrate through said semiconductor ceiling.

6. The plasma reactor of claim 5 wherein said inductive antenna is a planar coil parallel to the plane of said planar substrate.

7. The reactor of claim 4 wherein said ceiling portion has a planar disk shape.

8. The reactor of claim 1 wherein said inlet system further comprises:
    plural gas inlet ports;
    a center gas feed top sealed onto an exterior surface of said semiconductor ceiling; and
    a gas manifold formed between said center gas feed top and said semiconductor ceiling, said gas manifold encompassing said plural gas inlet ports in said semiconductor ceiling opening into said chamber.

9. The reactor of claim 1 wherein said semiconductor ceiling is comprised of a material containing silicon.

10. The reactor of claim 1 wherein said semiconductor ceiling is a scavenger for fluorine.

11. The reactor of claim 3 wherein said gas inlet ports are substantially confined to a center portion of said semiconductor ceiling.

12. The reactor of claim 3 wherein said gas inlet ports are located near a peripheral portion of said semiconductor ceiling.

13. A plasma reactor for processing a workpiece, said reactor comprising:
    a reactor enclosure defining a processing chamber;
    a base within said chamber for supporting said workpiece during processing thereof;
    said reactor enclosure comprising a thermally coupled semiconductor ceiling overlying said base, said semiconductor ceiling coupled in vacuum sealed relationship to said reactor enclosure to create and to maintain a vacuum seal within said processing chamber;
    apparatus overlying said semiconductor ceiling for coupling plasma source power into said chamber;
    a center gas feed top sealed onto an exterior surface of said semiconductor ceiling; and
    plural gas inlet ports in said semiconductor ceiling opening into said chamber.

14. A plasma reactor for processing a workpiece, said reactor comprising:
    a reactor enclosure defining a processing chamber;
    a base within said chamber for supporting said workpiece during processing thereof;
    said reactor enclosure comprising a semiconductor ceiling overlying said base, said semiconductor ceiling coupled in vacuum sealed relationship to said reactor enclosure to create and to maintain a vacuum seal within said processing chamber;
    apparatus overlying said semiconductor ceiling for coupling plasma source power into said chamber;
    a center gas feed top sealed onto an exterior surface of said semiconductor ceiling; and
    plural gas inlet ports in said semiconductor ceiling opening into said chamber.

15. A plasma reactor for processing a workpiece, said reactor comprising:
    a reactor enclosure defining a processing chamber;
    a base within said chamber for supporting said workpiece during processing thereof;
    said reactor enclosure comprising a semiconductor ceiling overlying said base, said semiconductor ceiling coupled in vacuum sealed relationship to said reactor enclosure to create and to maintain a vacuum seal within said processing chamber;
    apparatus overlying said semiconductor ceiling for coupling plasma source power into said chamber; and an inlet system in said semiconductor ceiling opening into said chamber;

wherein said workpiece is a planar substrate, said semiconductor ceiling comprises a ceiling portion of said reactor enclosure substantially parallel to and overlying said planar substrate;

wherein said apparatus for coupling plasma source power into said chamber comprises an inductive antenna facing said planar substrate through said semiconductor ceiling.

16. The plasma reactor of claim 15 wherein said inlet system is a gas inlet system for admitting a plasma precursor gas into said chamber.

17. The reactor of claim 16 wherein said gas inlet system comprises plural gas inlet ports in said ceiling opening into said chamber.

18. A plasma reactor for processing a workpiece, said reactor comprising:

a reactor enclosure defining a cylindrical processing chamber, said processing chamber having a chamber radius;

a base within said processing chamber for supporting said workpiece during processing thereof;

said reactor enclosure comprising a disk-shaped semiconductor ceiling overlying said base, said semiconductor ceiling having a ceiling radius generally equal to said chamber radius;

apparatus for coupling plasma source power into said chamber; and, an inlet system in said semiconductor ceiling opening into said chamber.

19. The plasma reactor of claim 18, wherein said inlet system is a gas inlet system for admitting a plasma precursor gas into said chamber.

20. The plasma reactor of claim 19, wherein said gas inlet system comprises plural gas inlet ports in said semiconductor ceiling opening into said chamber.

21. The plasma reactor of claim 18, wherein said workpiece is a planar substrate and said semiconductor ceiling is generally parallel to and overlying said planar substrate.

22. The plasma reactor of claim 21, wherein said apparatus for coupling plasma source power into said chamber comprises an inductive antenna generally parallel to said planar substrate.

23. The plasma reactor of claim 22, wherein said inductive antenna overlies at least of portion of said semiconductor ceiling.

* * * * *